US009960326B2

(12) United States Patent
Kuramoto et al.

(10) Patent No.: US 9,960,326 B2
(45) Date of Patent: *May 1, 2018

(54) LIGHT EMITTING DEVICE

(71) Applicant: NICHIA CORPORATION, Anan-shi (JP)

(72) Inventors: Masafumi Kuramoto, Tokushima (JP); Akiko Yamasaki, Anan (JP); Hirofumi Ichikawa, Tokushima (JP); Yasunori Shimizu, Tokushima (JP); Akihiro Ota, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/435,710

(22) Filed: Feb. 17, 2017

(65) Prior Publication Data

US 2017/0162765 A1 Jun. 8, 2017

Related U.S. Application Data

(63) Continuation of application No. 14/559,923, filed on Dec. 4, 2014, now Pat. No. 9,653,662.

(30) Foreign Application Priority Data

Dec. 5, 2013 (JP) .................. 2013-251586

(51) Int. Cl.
*H01L 33/00* (2010.01)
*H01L 33/56* (2010.01)
(Continued)

(52) U.S. Cl.
CPC .......... *H01L 33/56* (2013.01); *C09K 11/025* (2013.01); *C09K 11/7774* (2013.01);
(Continued)

(58) Field of Classification Search
CPC ........ H01L 33/508; H01L 33/54; H01L 33/62
(Continued)

(56) References Cited

U.S. PATENT DOCUMENTS 7,342,357 B2 * 3/2008 Sakano .................. B29C 67/08
257/E33.059
7,531,845 B2 5/2009 Oshio et al.
(Continued)

FOREIGN PATENT DOCUMENTS

CN 201829530 U 5/2011
EP 2472578 7/2012
(Continued)

OTHER PUBLICATIONS

Byung Mook Weon et al. "Self-Pinning by Colloids Confined at a Contact Line", Phys. Rev. Lett., Jan. 11, 2013, 110, 028303-1 (2013).

(Continued)

*Primary Examiner* — Tan N Tran
(74) *Attorney, Agent, or Firm* — Mori & Ward, LLP

(57) ABSTRACT

A light emitting device includes a base substrate having a recessed portion at a flat upper surface thereof. The recessed portion has an inner wall. A sealing member is provided in the recessed portion. The sealing member contains surface-treated particles, or particles coexisting with a dispersing agent. The particles have a particle diameter of 1 nm or more and 100 μm or less. The particles are made of an organic material or an inorganic material. The organic material and the inorganic material are free of a phosphor. The at least a part of an edge portion of the sealing member is a region located in the vicinity of an edge of the recessed portion which is a boundary between a surface of the inner wall and (Continued)

the flat upper surface. The at least one of the particles and aggregates of particles are unevenly distributed in the region.

21 Claims, 7 Drawing Sheets

(51) Int. Cl.
  *H01L 33/54* (2010.01)
  *H01L 33/50* (2010.01)
  *C09K 11/02* (2006.01)
  *C09K 11/77* (2006.01)
  *H01L 33/62* (2010.01)

(52) U.S. Cl.
  CPC ............ *H01L 33/50* (2013.01); *H01L 33/501* (2013.01); *H01L 33/502* (2013.01); *H01L 33/508* (2013.01); *H01L 33/54* (2013.01); *H01L 33/62* (2013.01); *H01L 33/0095* (2013.01); *H01L 2224/45144* (2013.01); *H01L 2224/48091* (2013.01); *H01L 2224/48247* (2013.01); *H01L 2224/48257* (2013.01); *H01L 2224/49113* (2013.01); *H01L 2933/0091* (2013.01)

(58) Field of Classification Search
  USPC .............................. 257/98, 99, 100, E33.056
  See application file for complete search history.

(56) References Cited

U.S. PATENT DOCUMENTS

| | | | | |
|---|---|---|---|---|
| 7,897,989 | B2* | 3/2011 | Kumura | H01L 33/56 257/100 |
| 8,674,388 | B2* | 3/2014 | Shioi | H01L 33/502 257/100 |
| 2003/0038295 | A1* | 2/2003 | Koda | H01L 33/507 257/98 |
| 2004/0256706 | A1 | 12/2004 | Nakashima | |
| 2006/0175716 | A1 | 8/2006 | Nakashima | |
| 2006/0220046 | A1 | 10/2006 | Yu et al. | |
| 2006/0267042 | A1 | 11/2006 | Izuno et al. | |
| 2007/0161316 | A1* | 7/2007 | Taguchi | H01L 33/50 445/25 |
| 2008/0231170 | A1 | 9/2008 | Masato et al. | |
| 2010/0237370 | A1 | 9/2010 | Kim et al. | |
| 2011/0182072 | A1 | 7/2011 | Shimizu et al. | |
| 2011/0210354 | A1 | 9/2011 | Ichikawa et al. | |
| 2012/0019123 | A1 | 1/2012 | Furukawa | |
| 2012/0049225 | A1 | 3/2012 | Wakaki | |
| 2012/0153342 | A1* | 6/2012 | Nishimura | C08L 83/04 257/99 |
| 2012/0161621 | A1 | 6/2012 | Sato | |
| 2012/0217528 | A1 | 8/2012 | Furukawa | |
| 2014/0084320 | A1 | 3/2014 | Ichikawa et al. | |
| 2014/0151737 | A1 | 6/2014 | Wakaki | |
| 2015/0280077 | A1 | 10/2015 | Wakaki | |

FOREIGN PATENT DOCUMENTS

| | | |
|---|---|---|
| JP | 2003-46141 | 2/2003 |
| JP | 2004-179644 | 6/2004 |
| JP | 2004-221163 | 8/2004 |
| JP | 2005-033194 | 2/2005 |
| JP | 2007-221044 | 8/2007 |
| JP | 2010-062272 | 3/2010 |
| JP | 2010-080620 | 4/2010 |
| JP | 2010-538453 | 12/2010 |
| JP | 2011-134785 | 7/2011 |
| JP | 2011-222718 | 11/2011 |
| JP | 2012-028501 | 2/2012 |
| JP | 2012-069539 | 4/2012 |
| JP | 2012-151466 | 8/2012 |
| KR | 2003-0031061 | 4/2003 |
| WO | WO 2009/005035 | 1/2009 |

OTHER PUBLICATIONS

Extended European Search Report for corresponding EP Application No. 14196232.4-1551, Apr. 16, 2015.
Office Action with Form PTO-892 Notice of References Cited issued by the U.S. Patent and Trademark Office for the parent U.S. Appl. No. 14/559,923, dated Oct. 6, 2015.
Office Action with Form PTO-892 Notice of References Cited issued by the U.S. Patent and Trademark Office for the parent U.S. Appl. No. 14/559,923, dated Mar. 3, 2016.
Office Action with Form PTO-892 Notice of References Cited issued by the U.S. Patent and Trademark Office for the parent U.S. Appl. No. 14/559,923, dated Aug. 1, 2016.
Notice of Allowance issued by the United States Patent and Trademark Office for the parent U.S. Appl. No. 14/559,923, dated Nov. 18, 2016.

* cited by examiner

LIGHT EMITTING DEVICE

CROSS-REFERENCE TO RELATED APPLICATIONS

The present application is a continuation application of the U.S. patent application Ser. No. 14/559,923 filed Dec. 4, 2014, which claims priority based on Japanese Patent Application No. 2013-251586 filed on Dec. 5, 2013 in Japan. The contents of these applications are incorporated herein by reference in their entirety.

BACKGROUND OF THE INVENTION

Field of the Invention

The disclosure relates to a light emitting device.

Description of the Related Art

Conventionally, some light emitting devices are manufactured by disposing a light emitting element in a recessed portion of a package, connecting the light emitting element to a lead frame via wires, filling a sealing resin into the recessed portion, and then curing the resin (see, for example, JP 2010-080620 A and JP 2011-222718 A).

SUMMARY OF THE INVENTION

According to one aspect of the present invention, a light emitting device includes a base substrate, a light emitting element, and a sealing member. The base substrate forms a package that includes a positive lead electrode, a negative lead electrode, and a molded body holding the positive and negative lead electrodes. The base substrate has a recessed portion at a flat upper surface thereof. The recessed portion has an inner wall and a bottom surface. The inner wall is inclined such that a diameter of the recessed portion increases in an upward direction from the bottom surface. The light emitting element is bonded to the bottom surface of the recessed portion. The sealing member is provided in the recessed portion that does not cover the flat upper surface of the base substrate. The sealing member contains surface-treated particles, or particles coexisting with a dispersing agent. The particles have a particle diameter of 1 nm or more and 100 μm or less. The particles are made of an organic material or an inorganic material. The organic material and the inorganic material are free of a phosphor. The at least a part of an edge portion of the sealing member is a region located in the vicinity of an edge of the recessed portion which is a boundary between a surface of the inner wall and the flat upper surface of the base substrate. The at least one of the particles and aggregates of particles are unevenly distributed in the region.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE INVENTION

Figure 1A:
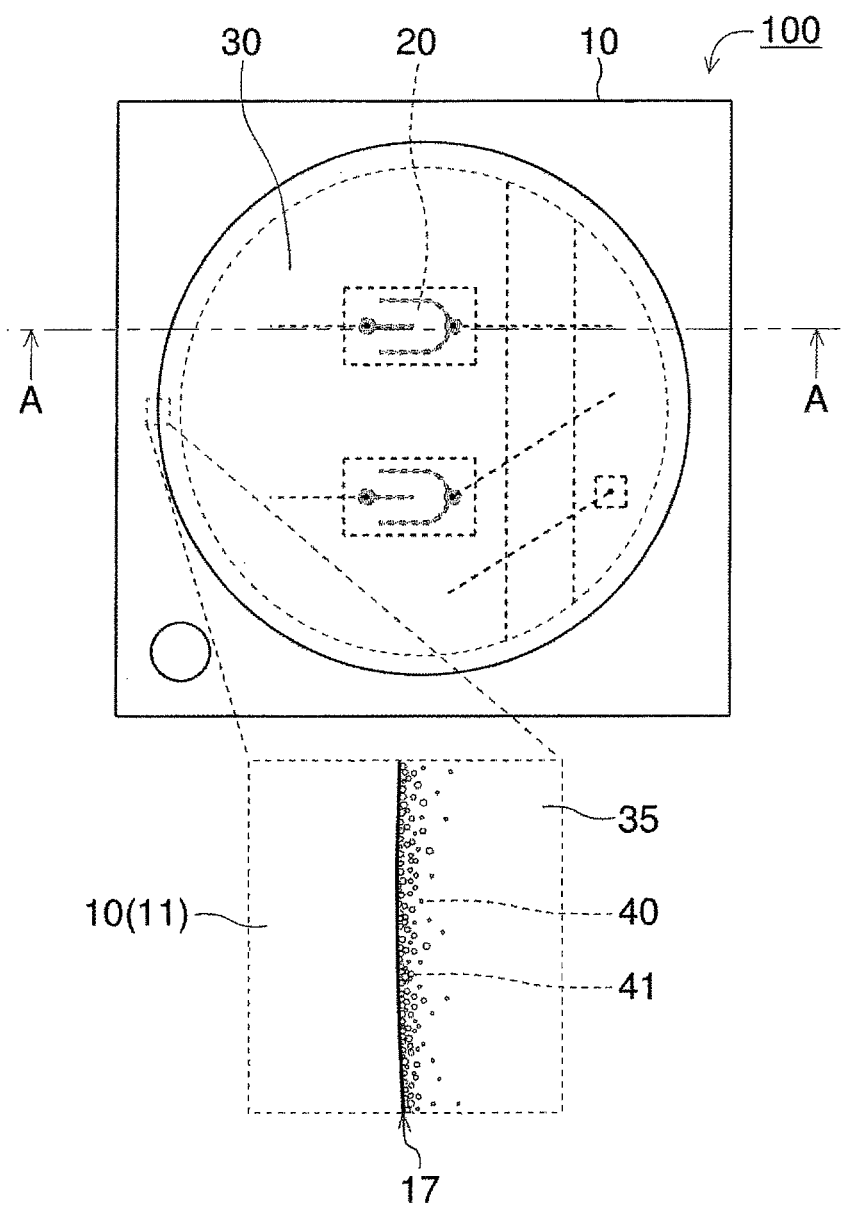
FIG. 1A is a schematic top view of a light emitting device according to one embodiment of the present invention.

The embodiments will now be described with reference to the accompanying drawings, wherein like reference numerals designate corresponding or identical elements throughout the various drawings.

Embodiments of the present invention will be described below with reference to the accompanying drawings as appropriate. Note that a light emitting device to be mentioned later is intended to embody the technical concept of the present invention, and not to restrict the scope of the present invention to the following embodiments unless otherwise specified. The contents of one embodiment and one Example of the present invention mentioned below can also be applied to other embodiments and Examples. In some drawings, the sizes or positional relationships of members are emphasized to clarify the description below.

First Embodiment

Figure 1B:
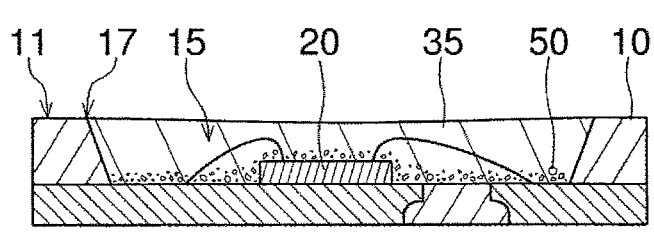
FIG. 1B is a schematic cross-sectional view taken along the line A-A of FIG. 1A.

FIG. 1A shows a schematic top view of a light emitting device according to a first embodiment of the present invention, and FIG. 1B is a schematic cross-sectional view taken along the line A-A of FIG. 1A.

As shown in FIGS. 1A and 1B, a light emitting device 100 in the first embodiment includes a base substrate 10, a light emitting element 20 and a sealing member 30. The base substrate 10 has a recessed portion 15 at its upper surface 11. The light emitting element 20 is provided in the recessed portion 15. The sealing member 30 is also provided in the recessed portion 15.

More specifically, the light emitting device 100 is a surface mounting type LED. The light emitting device 100 includes the base substrate 10 with the recessed portion 15 formed at the upper surface 11, two light emitting elements 20 accommodated in the recessed portion 15, and the sealing member 30 filled into the recessed portion 15 to cover all the light emitting elements 20. The base substrate 10 is a package including conductive members, and a molded body for holding the conductive members. The conductive members are a pair of positive and negative lead electrodes. The molded body may be a white resin molded body. A part of the bottom surface of the recessed portion 15 of the base substrate is constituted by the upper surfaces of the conductive members. Each of the two light emitting elements 20 may be a LED element, bonded to the bottom surface of the recessed portion 15 of the base substrate by an adhesive, and connected to the conductive members via the wires. The sealing member 30 includes resin as a base material 35. The sealing member 30 may contain phosphors 50. The phosphors 50 are unevenly distributed on the bottom side of the recessed portion 15.

The sealing member 30 contains particles 40 surface-treated. At least a part of the edge portion of the sealing member 30 is a region located in the vicinity of an edge 17 of the recessed portion, and in which at least one of the particles 40 and aggregates 41 of the particles 40 are unevenly distributed.

Thus, the light emitting device 100 with this arrangement can suppress the leakage and spread of the sealing member 30 from the recessed portion 15 of the base substrate onto the upper surface 11 thereof due to high wettability of a liquid base material of the sealing member.

The region of the sealing member 30 located in the vicinity of the edge 17 of the recessed portion of the base substrate and in which at least one of the particles 40 and aggregates 41 thereof are unevenly distributed may be a part of the edge portion of the sealing member 30, but preferably occupies half or more the edge portion of the sealing member 30 (for example, half or more the entire periphery of the edge part), and more preferably occupies substantially the entire edge portion of the sealing member 30 (for example, the substantially entire length of the entire periphery of the edge part).

The edge (border) 17 of the recessed portion 15 of the base substrate as used in the present specification indicates a boundary between an inner wall surface of the recessed portion 15 of the base substrate and the upper surface 11. Further, the vicinity of the edge 17 of the recessed portion of the base substrate corresponds to the vicinity of the above-mentioned boundary, and includes not only the inner wall surface side of the recessed portion 15 of the base substrate, but also the upper surface 11 side of the base substrate.

In this embodiment, the surface-treated particles 40 may be replaced by particles that coexist with a dispersing agent (e.g. particles together with a dispersing agent). In this case, the same function and effect can be obtained. The particles coexisting with the dispersing agent are produced by blending particles and the dispersing agent for dispersing the particles into the sealing member, and as a result, for example, become particles with the dispersing agent adsorbed thereto.

Now, a description will be given of the principle that the leakage and spread of the sealing member 30 onto the upper surface 11 of the base substrate is suppressed by at least one of the particles 40 and the aggregates 41.

Figure 2A:
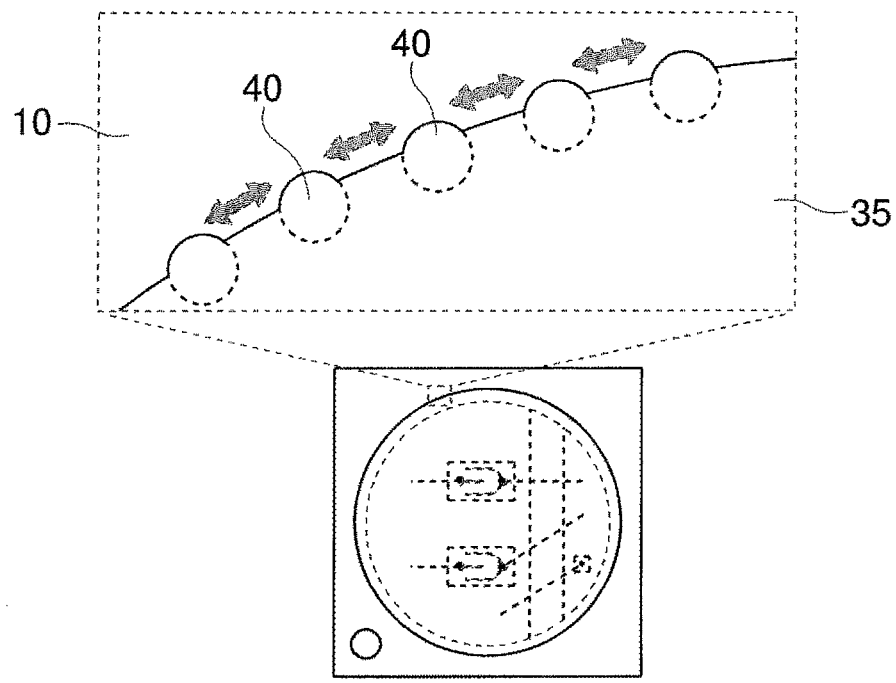
FIGS. 2A and 2B are schematic diagrams for explaining the principle of suppressing the leakage and spread of a sealing member in the embodiment of the present invention.
Figure 2B:
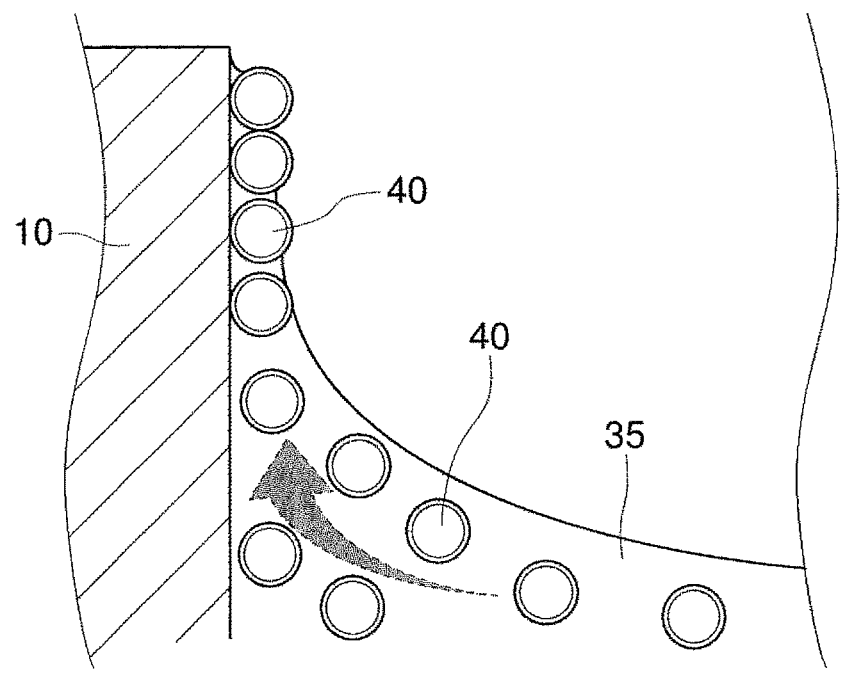

FIGS. 2A and 2B are schematic diagrams for explaining the principle of suppressing the leakage and spread of the sealing member in the embodiment of the present invention. The principle of suppressing the leakage and spread of the sealing member includes two stages. A first stage will be described below with reference to FIG. 2A. In the first stage, the particles 40 that have little interaction therebetween, that is, which have the cohesive property suppressed are dispersed into a liquid base material 35 of the sealing member, preferably, substantially uniformly dispersed thereinto. The material of the sealing member 30 before solidification forms a meniscus end in the vicinity of the edge 17 of the recessed portion when the material are put into the recessed portion 15 of the base substrate. A capillary force is generated between the particle 40 existing at the tip of the meniscus end (near a contact point among three phases, namely, air (gas), a base material (liquid) of the sealing member, and a base substrate (solid)), and the particle 40 existing at the tip of the adjacent meniscus end. The capillary force works to draw the particles 40 existing at the tips of the adjacent meniscus ends close to each other. Then, the capillary force continuously acts along the edge portion of the sealing member 30 (in this embodiment, the edge 17 of the recessed portion of the base substrate), which can suppress the leakage and spread of the sealing member 30 put into the recessed portion 15 of the base substrate before its solidification. In particular, the capillary force works along the substantially entire edge portion of the sealing member 30 (in this embodiment, the substantially entire region of the edge 17 of the recessed portion of the base substrate), which can effectively suppress the leakage and spread of the sealing member 30 before its solidification. Note that the capillary force tends to be generated in a colloid solution having a high dispersibility of particles (see, for example, B M. Weon, J H. Je, Self-Pinning by Colloids Confined at a Contact Line, Phys. Rev. Lett. 110, 028303 (2013)). Thus, the capillary force can be effectively exhibited by applying a surface treatment to the particles 40 for suppressing the agglomeration of the particles, or by blending the dispersing agent with the particles 40.

A second stage will be described below with reference to FIG. 2B. The second stage involves heating for promoting the solidification of the sealing member 30. During the step of solidifying the sealing member 30, the above-mentioned meniscus end is very thin, so that a low-boiling point component of the base material 35 of the sealing member (for example, a low-boiling point siloxane of a silicone resin) vaporizes most quickly. A change in surface tension at the meniscus end due to the vaporization causes the flow of surface tension toward the meniscus end within the sealing member 30 before its solidification. Then, the sealing member 30 before its solidification delivered to the meniscus end is suppressed from leaking and spreading by the above capillary force to be returned inside the meniscus end. As a result, a convective flow is generated at the meniscus end. During this process, the particles 40 delivered by the convective flow at the meniscus end are arranged in line by the capillary force, or are agglutinated due to a local increase in concentration of the particles. In this way, the particles 40 agglutinated at the edge portion of the sealing member 30 further suppress the leakage and spread of the sealing member 30 which has its volume expanding by being heated and whose viscosity and surface tension are decreased.

In the way mentioned above, at least a part of the edge portion of the solidified sealing member 30 is a region in which at least one of the particles 40 and aggregates 41 thereof are unevenly distributed. Since the capillary force depends on the dispersibility of the particles, the number of the particles 40 is preferably larger than that of the aggregates 41 of the particles from the viewpoint of suppressing the leakage and spread of the sealing member 30. However, the capillary force also acts on the aggregates 41 of the particles. The particles 40 are agglutinated while the sealing member 30 is solidified. As a result, a relatively large number of the aggregates 41 of the particles are often observed in the solidified sealing member 30.

The term "unevenly distributed" as used in the present specification means the existence in a specific region in high density, but does not deny the existence in low density in a region other than the specific region. One preferred embodiment of the state of being "unevenly distributed" means the existence in the specific region in high density with nothing existing in other regions.

Embodiments of the light emitting device 100 will be described below.

(Particle 40)

The particles 40 are blended into the base material 35 of the sealing member, and have a function of suppressing the leakage and spread of the sealing member 30 onto the upper surface 11 of the base substrate. The particle 40 will be described in detail below. Note that when the particles 40 are intended to be distinguished from a filler and a phosphor to be mentioned later for convenience in writing, hereinafter, the particle 40 is referred to as a first particle, and the filler and the phosphor as other particles are referred to as a second particle and a third particle, respectively.

The particle 40 for use can have a particle diameter of, for example, 1 nm or more and 100 µm or less, but are preferably a nanoparticle (which can be defined as a particle with a particle diameter of 1 nm or more and 100 nm or less). The particles 40 which are nanoparticles can obtain the capillary force even in a small amount, which can suppress the leakage and spread of the sealing member 30 onto the upper surface 11 of the base substrate. Especially, the particle 40 preferably has a particle diameter of 5 nm or more and 50 nm or less. The aggregates 41 of the particles are produced by agglutinating the particles 40. The aggregates 41 of the particles are easily observed because of its larger size than the particle 40, so that the observation of the existence of the aggregate 41 can presume the existence of the particles 40. The diameter of the aggregate 41 of the particles is, for example, in a range of about 100 nm to about 300 µm, and preferably 100 nm or more and 100 µm or less. The particles 40 and the aggregate 41 thereof may have the function of scattering the light from the light emitting element 20. In particular, when the particle 40 is a nanoparticle, a short-wavelength light, such as blue ray, can be increasingly scattered by Rayleigh scattering. The occurrence of the Rayleigh scattering easily excites the phosphor 50. Thus, the blending amount of the phosphor 50 can be decreased to reduce the cost of the light emitting device. Further, a transmittance of the sealing member 30 can be improved to enhance the light extraction efficiency. Note that the particle diameter of the particle 40 can be defined by an average particle diameter ($D_{50}$). The diameter of the particle 40 or aggregate 41 can be measured by a laser diffusion-scattering method, an image analysis method (scanning electron microscope (SEM), transmission electron microscope (TEM)), a dynamic light scattering, an X-ray small angle scattering method, or the like. More specifically, $D_{50}$ determined by observing a section using SEM or the like can be used as the diameter of the particle 40 or aggregate 41.

The shape of the particle 40 is not specifically limited, and may have an irregular crushed shape or the like. However, the particle 40 preferably has a spherical shape, and thus can minimize the contact between the particles to suppress the agglomeration of the particles. The particles 40 having a plate-like shape can impart a gas barrier property to the sealing member 30.

The particle 40 is not specifically limited, but may be an organic material or inorganic material. The particle 40 is preferably made of translucent material in terms of the light extraction efficiency of the light emitting device. The particle 40 preferably has a melting point of 260° C. or higher from the viewpoint of resistance to heat for soldering. Specifically, the organic materials preferably include polymethacrylic acid ester and its copolymer, polyacrylic acid ester and its copolymer, a cross-linked polymethacrylic acid ester, a cross-linked polyacrylic acid ester, polystyrene and its copolymer, a cross-linked polystyrene, an epoxy resin, a silicone resin, amorphous fluorine resin, and the like. The particle 40 may include a core-shell type particle that is obtained by coating an inorganic particle with at least one resin selected from the above materials. Such an organic particle can match its refractive index with that of the base material 35 of the sealing member by copolymerization. Even though the particles are agglutinated, the aggregates can maintain its translucency or the like, which has little influence on optical properties. On the other hand, the inorganic materials preferably include silicon oxide, aluminum oxide, zirconium oxide, titanium oxide, zinc oxide, magnesium oxide, gallium oxide, tantalum oxide, niobium oxide, bismuth oxide, yttrium oxide, iridium oxide, indium oxide, tin oxide, and the like. Such an inorganic particle has excellent resistance to heat and light, and also has a relatively high thermal conductivity. Among them, silicon oxide, aluminum oxide, zirconium oxide, and titanium oxide are easily available, and relatively inexpensive. In addition, the particle 40 for use can be made of the same material as that of the phosphor 50 to be mentioned later.

The particle 40 preferably undergoes the surface treatment (that is, an attached substance is formed on the surface of each particle 40 through the surface treatment). As a result, the agglomeration of the particles 40 is suppressed, in other words, the dispersibility of the particles 40 is improved, which can easily generate the above capillary force to suppress the leakage and spread of the sealing member 30 onto the upper surface 11 of the base substrate. The surface treatment on the particles 40 is performed using, for example, long-chain aliphatic amine or a derivative thereof, long-chain aliphatic fatty acid or a derivative thereof, a silane coupling agent, a siloxane compound having an amine group and/or a carboxyl group, a siloxane compound having at least one selected from the group consisting of a silanol group, a hydrogen silane group and an alcohol group, a siloxane compound having a vinylsilyl group and at least one selected from the group consisting of a silanol group, an alkoxyl group and a hydrogen silane group, a siloxane compound having a monoglycidyl ether endgroup, a siloxane compound having a monohydroxyl ether endgroup, an organic silazane compound, an organic titanate compound, an isocyanate compound, an epoxy compound, a phosphate compound, a phosphoester compound, and the like (that is, such a derivative and/or a compound is attached to the surface of the particle 40 by the surface treatment). The dispersing agents can include, in addition to the surface treatment material, a polymer compound having an acid group or a basic group, a fluorine-contained surfactant agent, a polyol compound, a polyethylene oxide derivative, a polypropylene oxide derivative, a polyvalent fatty acid derivative, a hydrolysate of a silane coupling agent, a quaternary ammonium salt compound, and the like. The particle 40 which is a nanoparticle is preferably subjected to the surface treatment. On the other hand, the particle 40 which is a micron particle is preferably blended with the dispersing agent.

Figure 3:
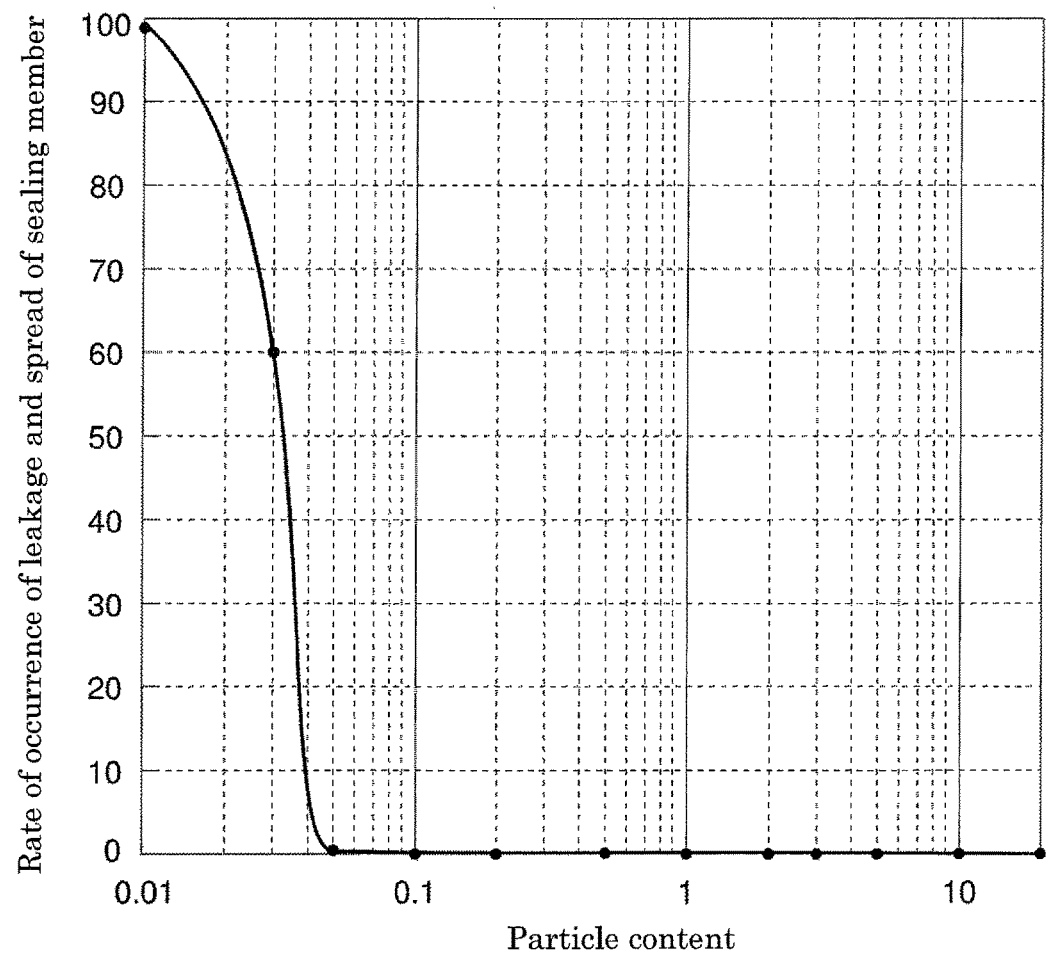
FIG. 3 is a graph showing the relationship between the content of surface-treated particles of the sealing member, and the leakage and spread of the sealing member onto the upper surface of the base substrate in the light emitting device in the one embodiment of the present invention.

FIG. 3 is a graph showing the relationship between the content of surface-treated particles of the sealing member and the leakage and spread of the sealing member onto the upper surface of the base substrate in the light emitting device 100 of the first embodiment. A rate of occurrence of the leakage and spread of the sealing member shown in FIG. 3 was determined through calculation by defining the leakage and spread of the sealing member leading to a cut position of an upper surface of the base substrate 10 (to an angle formed by the upper surface of the base substrate 10 and its end surface) in a singulating step of the light emitting device to be mentioned later as "occurrence", and also defining the leakage and spread below this boundary as "non-occurrence". As shown in FIG. 3, when the content of the particles 40 and/or the aggregates 41 thereof is 0.05% by weight or more, the effect of suppressing the leakage and spread of the sealing member 30 onto the upper surface 11 of the base substrate can be easily obtained. The upper limit of the content of the particles 40 and/or the aggregates 41 thereof is not specifically limited from the viewpoint of obtaining the effect of suppressing the leakage and spread of the sealing member 30. However, when the content of the particles 40 and/or the aggregates 41 thereof exceeds 50% by weight, the excessive increase in viscosity or the white turbidity of the sealing member 30, or the excessive agglomeration of the particles 40 might be caused. Thus, the content of the particles 40 and/or the aggregates 41 thereof is preferably 0.05% by weight or more and 50% by weight or less. In particular, when the content of the particles 40 and/or the aggregates 41 thereof is preferably 0.1% by weight or more and 20% by weight or more, the effect of suppressing the leakage and spread of the sealing member 30 onto the upper surface 11 of the base substrate is stably obtained, while appropriately maintaining the properties of the sealing member 30. The content of the particles 40 and/or the aggregates 41 thereof is more preferably 0.2% by weight or more and 2.0% by weight or less, and further may be 0.2% by weight or more and less than 0.5% by weight. Note that the content of the particles 40 and/or the aggregates 41 thereof corresponds to the amount of blending of the particles 40, and is represented in weight percent as a ratio with respect to the base material 35 of the sealing member. In this way, the blending of the particles 40 in a small amount can suppress the leakage and spread of the sealing member 30 onto the upper surface 11 of the base substrate, which is a great advantage in manufacturing the light emitting device.

In the light emitting device 100, the end surface of the base substrate 10 is a cut surface. When the sealing member unexpectedly leaks or spreads from the recessed portion of the base substrate onto the upper surface, the upper surface of the sealing member cannot be easily formed in a convex shape expanding upward, which makes it difficult to enhance a luminous flux density, or which causes a failure of solder leakage due to the leakage or spread of the sealing member onto the conductive member. However, the most serious problem is failure caused in the singulating process of the base substrate. Some light emitting devices are manufactured by performing a series of processes with a plurality of base substrates connected together in the longitudinal and lateral directions until the sealing step is finished, and then singulating the connected substrates into separated pieces. In the singulating step of the light emitting device, when cutting the sealing member formed across the upper surfaces of the adjacent base substrates by a dicer or the like, burrs might be caused in a cut part of the sealing member. Such burrs of the sealing member might worsen the appearance of the light emitting device and light distribution, or might cause damages to the light emitting devices during storing the light emitting devices in large numbers. In this way, the suppression of the leakage and spread of the sealing member onto the upper surface of the base substrate is very advantageous to the light emitting device manufactured accompanied by the cutting process of the base substrate.

The silicone resin is a relatively soft resin, and is difficult to cut by the dicer or the like. If the silicone resin needs to be cut, the singulating step of the light emitting devices would be complicated. In particular, the suppression of the leakage and spread of the sealing member 30 onto the upper surface 11 of the base substrate is further advantageous to the light emitting device in which the base material 35 of the sealing member is made of silicone resin, modified silicone resin, silicone modified resin or hybrid silicone resin.

Second Embodiment

Figure 4A:
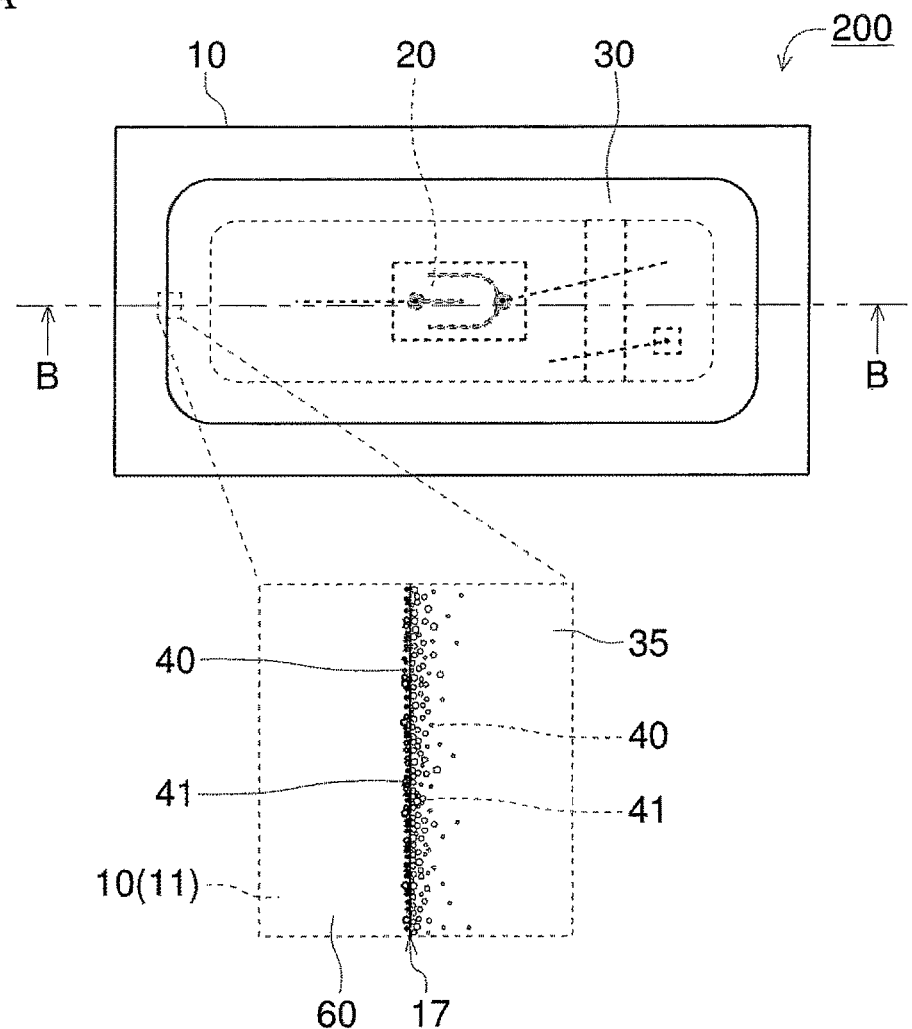
FIG. 4A is a schematic top view of a light emitting device according to another embodiment of the present invention.
Figure 4B:
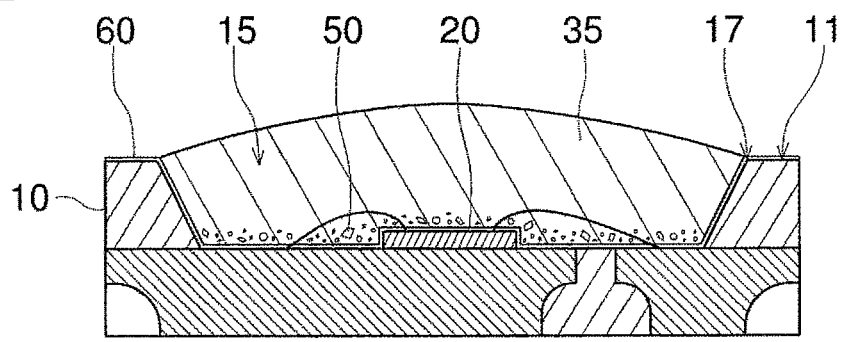
FIG. 4B is a schematic cross-sectional view taken along the line B-B of FIG. 4A.

FIG. 4A shows a schematic top view of a light emitting device according to a second embodiment of the present invention, and FIG. 4B is a schematic cross-sectional view taken along the line B-B of FIG. 4A.

As shown in FIGS. 4A and 4B, a light emitting device 200 in the second embodiment includes the base substrate 10, the light emitting element 20, and the sealing member 30. The base substrate 10 has a recessed portion 15 at its upper surface 11. The light emitting element 20 is provided in the recessed portion 15. The sealing member 30 is also provided in the recessed portion 15.

More specifically, the light emitting device 200 is a surface mounting type LED. The light emitting device 200 includes the base substrate 10 with the recessed portion 15 formed at the upper surface 11, one light emitting element 20 accommodated in the recessed portion 15, and the sealing member 30 filled into the recessed portion 15 to cover the light emitting element 20. The base substrate 10 is a package including conductive members, and a molded body for holding the conductive members. The conductive members are a pair of positive and negative lead electrodes. The molded body may be a white resin molded body. A part of the bottom surface of the recessed portion 15 of the base substrate is constituted by the upper surfaces of the conductive members. The light emitting element 20 may be a LED element, and is bonded to the bottom surface of the recessed portion 15 of the base substrate with an adhesive and thus connected to the conductive members via wires. The sealing member 30 includes resin as a base material 35. The sealing member 30 may contain phosphors 50. The phosphors 50 are unevenly distributed on the bottom side of the recessed portion 15.

The sealing member 30 contains particles 40 surface-treated. At least a part of the edge portion of the sealing member 30 is a region located in the vicinity of the edge 17 of the recessed portion, and in which at least one of the particles 40 and aggregates 41 thereof are unevenly distributed.

The light emitting device 200 with such a structure can also suppress the leakage and spread of the sealing member 30 from the recessed portion 15 of the base substrate onto the upper surface 11. Also in this embodiment, the surface-treated particles 40 can have the same functions and effects even by being replaced by particles coexisting with a dispersing agent. The particles coexisting with the dispersing agent may be produced by blending particles and the dispersing agent for dispersing the particles into the sealing member, and as a result become particles with the dispersing agent adsorbed thereto.

In the light emitting device 200, at least one of the particles 40 and the aggregates 41 thereof also exist at the outer edge portion of the sealing member 30, that is, in the vicinity located outside of the edge portion of the sealing member 30. The particles 40 and/or the aggregates 41 thereof existing at the outer edge portion of the sealing member 30 can act to interrupt the sealing member 30 to thereby suppress the leakage and spread of the sealing member 30 onto the upper surface 11 of the base substrate.

In the light emitting device 200, the upper surface of the sealing member 30 is formed in a convex shape extending upward. The sealing member 30 is suppressed from leaking and spreading onto the upper surface 11 of the base substrate due to the particles 40 and/or the aggregates 41 unevenly distributed at the edge portion of the sealing member. Thus, the amount of the base material 35 tends to be increased, thereby easily shaping the upper surface of the sealing member extending upward in the convex shape. As a result, the light emitting device with excellent light extraction efficiency can be easily obtained.

In the light emitting device 200, an inorganic coating 60 may be formed over the upper surface 11 of the base substrate. The coating 60 is to suppress the degradation of the conductive member due to outside air or moisture. The coating 60 may be formed over at least the conductive member in terms of function. Normally, after mounting the light emitting element 20 inside the recessed portion 15 of the base substrate, the coating 60 is formed across the substantially entire region of the upper surface of the base substrate 10. The coating 60 is made of, for example, aluminum oxide, silicone oxide, aluminum nitride, silicon nitride, or a mixture thereof. The thickness of the coating 60 is preferably 1 nm or more and 50 nm or less, and more preferably 2 nm or more and 25 nm or less. The formation method of the coating 60 may be sputtering or the like, but preferably an atomic layer deposition (ALD) method that can form a film with a constant certain thickness with high accuracy. In this way, the inorganic coating 60 has a relatively large surface energy, and allows the sealing member 30 to easily leak or spread onto the upper surface 11 of the base substrate. Thus, the suppression of the leakage and spread of the sealing member 30 onto the upper surface 11 of the base substrate is very advantageous to the light emitting device in which the inorganic coating 60 is formed over the upper surface 11 of the base substrate.

The respective components of the light emitting device in the embodiments of the present invention will be described below.

(Base Substrate 10)

The base substrate serves as a member for a case or base over which the light emitting element is mounted. The base substrate may be mainly composed of the conductive member electrically connected to the light emitting element, and a molded body for holding the conductive element. The base substrate may take the form of a package, a wiring substrate and the like. Specifically, the base substrate can be a resin molded body formed integrally with a lead frame by transfer molding, injection molding or the like, or a product formed by laminating ceramic green sheets with a conductive paste printed thereon, and then calcining them, and the like. The upper surface of the base substrate is preferably substantially flat, but may be warped. The upper surface of the base substrate has a recessed portion formed therein. The recessed portion may be formed by recessing a molded body itself. Alternatively, a framed-like protrusion may be additionally formed on the substantially flat upper surface of the molded body to thereby form the recessed portion inside an area surrounded by the protrusion. The recessed portion can have a rectangular shape, a rectangular shape with a rounded edge, a circular shape, an ellipse shape, or the like as viewed from the top side. The sidewall surface of the recessed portion is preferably inclined (which can include the warped surface) such that the diameter of the recessed portion is enlarged upward from the bottom surface thereof in order to easily release the molded body from the die and to effectively extract the light from the light emitting element (in which an inclination angle is, for example, in a range of 95° or more and 120° or less from the bottom surface of the recessed portion). The depth of the recessed portion is not specifically limited, but for example, 0.05 mm or more and 2 mm or less, preferably 0.1 mm or more and 1 mm or less, and more preferably 0.25 mm or more and 0.5 mm or less.

(Conductive Member)

Materials suitable for use in the conductive member can be metal material capable of exhibiting conductivity by being connected to the light emitting element. Specifically, the conductive member can be a lead electrode or wiring formed of gold, silver, copper, iron, aluminum, tungsten, cobalt, molybdenum, chrome, titanium, nickel, palladium, or an alloy thereof, phosphor bronze, iron-contained copper, and the like. The conductive member may have as its surface layer, a coating or light reflective film made of silver, aluminum, rhodium, gold, copper, or an alloy thereof. Among them, silver having excellent reflectivity is preferable.

(Molded Body)

Materials for the molded body can include, as a base material, thermoplastic resins such as an alicyclic polyamide resin, a semi-aromatic polyamide resin, polyethylene terephthalate, polycyclohexane terephthalate, a liquid crystal polymer, a polycarbonate resin, syndiotactic polystyrene, polyphenylene ether, polyphenylene sulfide, a polyether sulfone resin, a polyether ketone resin, and a polyarylate resin; and thermosetting resins such as a polybismaleimide triazine resin, an epoxy resin, a modified epoxy resin, a silicone resin, a modified silicone resin, a polyimide resin, and a polyurethane resin. Into the base material, a filler or coloring pigment can be blended. The fillers or coloring pigments can include particles or fiber made of glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, zinc oxide, silicon carbide, antimony oxide, zinc stannate, zinc borate, iron oxide, chrome oxide, manganese oxide, carbon black, and the like. Additionally, the molded body can also be formed of ceramics containing aluminum oxide, aluminum nitride, or a mixture thereof. Such ceramic has normally a larger surface energy than the above resin material, and thus allows the sealing member to easily leak and spread onto the upper surface of the base substrate.

(Light Emitting Element 20)

The light emitting element can use the semiconductor light emitting element, such as a LED (light emitting diode) element. The light emitting element may be an element including an element structure configured of various semiconductors and provided with a pair of positive and negative electrodes. In particular, the light emitting element preferably includes a nitride semiconductor ($In_xAl_yGa_{1-x-y}N$, $0 \leq x$, $0 \leq y$, $x+y \leq 1$) that can effectively excite the phosphor. In addition, the light emitting element may be a gallium arsenide semiconductor element, or a gallium phosphide semiconductor element. The light emitting element with a pair of positive and negative electrodes provided on the same surface side is face-up mounted by connecting the respective electrodes to the conductive member via wires, or face-down (flip-chip) mounted by connecting the respective electrodes to the conductive member by a conductive adhesive. In a light emitting element having a pair of positive and negative electrodes respectively on opposed surfaces thereof, a lower surface electrode is bonded to the conductive member by the conductive adhesive, and an upper surface electrode is connected to the conductive member by the wires. The number of light emitting elements mounted on one light emitting device may be one or plural. The light emitting elements can be connected in series or in parallel.
(Sealing Member 30)

The sealing member is a member for sealing the light emitting element. The base material of the sealing member has the electric insulation, and can transmit light emitted from the light emitting element (preferably, transmittance of 70% or more). The base material before solidification had better be material having fluidity. Specifically, suitable materials for the base material of the sealing member can include a silicone resin, an epoxy resin, a phenol resin, a polycarbonate resin, an acrylic resin, a TPX resin, a polynorbornene resin, a modified resin thereof or a hybrid resin thereof, and the like. Among them, the silicone resin or a modified resin thereof is preferably because of having excellent resistance to heat and light and a little volume contraction after solidification of the resin. The sealing member preferably contains a filler, phosphor, and the like in the base material, but does not need to contain them.
(Filler)

The filler for use can be made of a diffusing agent, coloring agent, or the like. Specifically, suitable materials for the filler can include silica, titanium oxide, magnesium oxide, magnesium carbonate, magnesium hydroxide, calcium carbonate, calcium hydroxide, calcium silicate, zinc oxide, barium titanate, aluminum oxide, iron oxide, chrome oxide, manganese oxide, glass, carbon black, and the like. The shapes of the filler can include, for example, a spherical shape, an irregular crushed shape, a needle-like shape, a columnar shape, a plate-like shape (including a scale-like shape), a fiber-like shape, a dendritic shape, and the like (the same goes for the phosphor to be mentioned later). The filler may be made of hollow or porous material.
(Phosphor 50)

The phosphor absorbs at least a part of a primary light emitted from the light emitting element and then outputs a secondary light with a wavelength different from that of the primary light. Specifically, the phosphors can include an yttrium-aluminum-garnet activated by cerium, a nitrogen-containing calcium aluminosilicate activated by europium and/or chromium, a sialon activated by europium, a silicate activated by europium, a potassium fluosilicate activated by manganese, or the like. Thus, the light emitting device can be one that emits primary and secondary lights with visible wavelengths in a mixed color (for example, a white color), or one that emits a secondary light with a visible wavelength which is excited by a primary ultraviolet light.
(Wire)

The wire is a member for electrically connecting the electrodes of the light emitting element to the conductive members. Specifically, the wire for use can be a metal wire made of gold, copper, silver, platinum, aluminum, or an alloy thereof. In particular, a gold wire is preferable because the gold wire is less likely to be broken due to stress from the sealing member and has excellent heat resistance or the like. In order to obtain the high light extraction efficiency, the wire may have at least its surface coated with silver.
(Adhesive)

An adhesive is a member for bonding the light emitting element to the base substrate. The insulating adhesives for use can include, epoxy resin, silicone resin, polyimide resin, or a modified resin thereof or a hybrid resin thereof, or the like. The conductive adhesive for use can include a conductive paste, such as silver, gold or palladium, a solder, such as a gold-tin based solder, or a wax made of a low-melting point metal or the like.

EXAMPLES

Examples according to the embodiments of the present invention will be described in detail below. It is apparent that the present invention is not limited to the following Examples.

Example 1

A light emitting device of Example 1 is a top-view type SMD (surface-mount-device) LED that has the structure of the light emitting device 100 shown in FIGS. 1A and 1B.

The base substrate had a rectangular parallelepiped having dimensions of 3.0 mm in length, 3.0 mm in width, and 0.52 mm in thickness. The base substrate was formed as a package made up of the molded body integrally formed with a pair of (first and second) positive and negative lead electrodes. The base substrate was manufactured by setting a processed metal plate (lead frame) with a plurality of sets of lead electrodes connected in the longitudinal and lateral directions via suspension leads in a die, injecting a liquid material for the molded body into the die, solidifying the material, followed by removal of the die, and then cutting (singulating) the base substrate. In this example, the cutting of the base substrate was performed after a sealing step of the light emitting element.

Each of the first and second lead electrodes was a plate-like small piece having a maximum thickness of 0.2 mm, made of a copper alloy, and having its surface coated with silver coating. Exposed regions of the lower surface of the first and second lead electrodes were substantially coplanar with the lower surface of the molded body, thereby forming the lower surface of the base substrate. Each of the first and second lead electrodes had a part of an end surface of the base substrate (cut suspension lead portion) exposed. The exposed part had pits serving as a casterllation.

The molded body had a square appearance with 3.0 mm length, and 3.0 mm width as viewed from the upper side, and 0.52 mm in maximum thickness. The molded body was made of epoxy resin containing titanium oxide. A recessed portion having a circular shape as viewed from the upper side was formed on the upper surface of the molded body, specifically, substantially at the center of the upper surface of the base substrate. The recessed portion had a diameter of 2.48 mm, and a depth of 0.32 mm. An inclination angle of the sidewall surface of the recessed portion was 95° with respect to the bottom surface of the recessed portion.

The upper surface of each of the first and second lead electrodes constituted a part of the bottom surface of the recessed portion. The two light emitting elements were bonded to the upper surface of the first lead electrode with an adhesive made of silicone resin. Each of the two light emitting elements was a LED element including a laminate of nitride semiconductor element structures stacked on a sapphire substrate, and had the dimensions of 350 µm in length, 550 µm in width and 120 µm in thickness. Each light emitting element can emit blue light (with a center wavelength of about 460 nm). In each of the two light emitting elements, one of p and n electrodes was connected to the upper surface of the first lead electrode via a wire, and the other of the p and n electrodes was connected to the upper surface of the second lead electrode via a wire. The wire was a gold wire having a diameter of 25 µm.

A protection element which was a Zener diode having an opposed electrode structure with 150 μm in length, 150 μm in width and 85 μm in thickness was bonded to the upper surface of the second lead electrode with a conductive adhesive made of a silver paste. The protective element had its upper surface electrode connected to the upper surface of the first lead electrode via a wire.

The recessed portion of the base substrate was filled with the sealing member to cover the light emitting elements. The sealing member contained a phenyl silicone resin as a base material, a phosphor of Yttrium aluminum garnet (YAG: Ce) excited by cerium in the base material, and a filler (having 6 μm in diameter) made of silica, and particles of zirconium oxide. The particle of the zirconium oxide had a particle diameter of about 5 nm, and undergoes a surface treatment of a siloxane compound. The particles were blended in 0.2% by weight into the resin of the base material. The upper surface of the sealing member was substantially coplanar with the upper surface of the base substrate, and specifically, had a substantially flat surface (strictly speaking, with a slight recessed surface due to hardening and contraction). The sealing member was formed by putting the liquid material into the recessed portion of the base substrate by use of a dispenser or the like, and heating and solidifying the material. The phosphors were unevenly distributed on the bottom side of the recessed portion.

Figure 5:
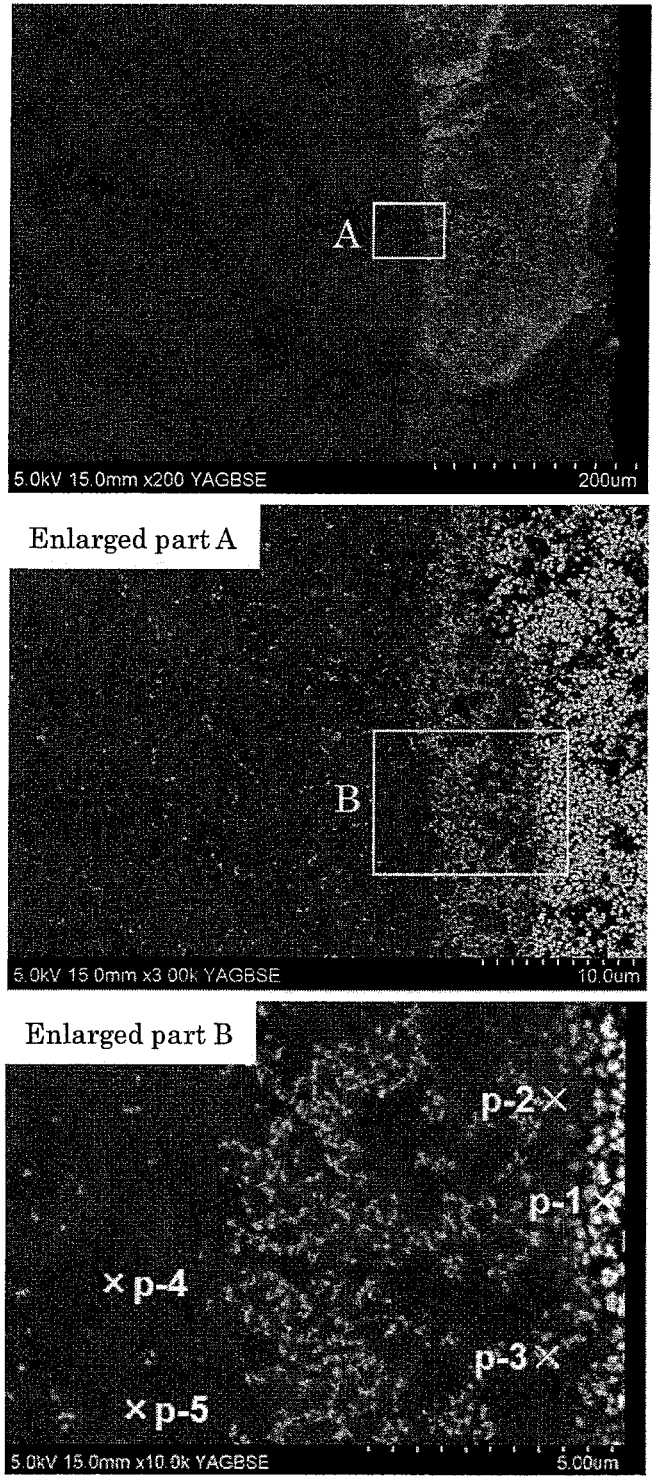
FIG. 5 shows images of the top surface of an edge portion of the sealing member in the light emitting device observed by a scanning electron microscope in one Example of the present invention.
Figure 6:
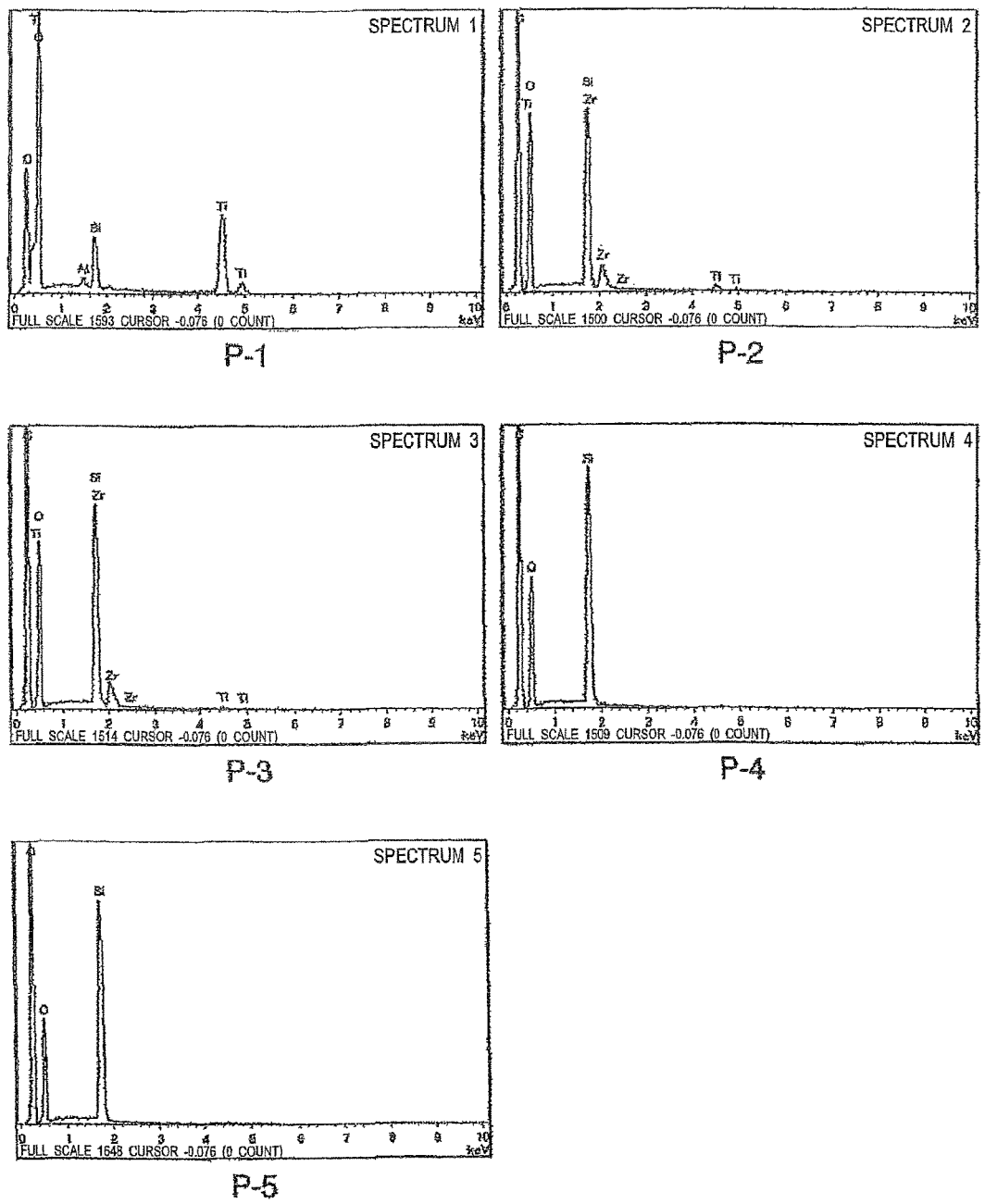
FIG. 6 is data on the result of an energy dispersive X-ray analysis of the edge portion of the sealing member shown in FIG. 5.
Figure 7:
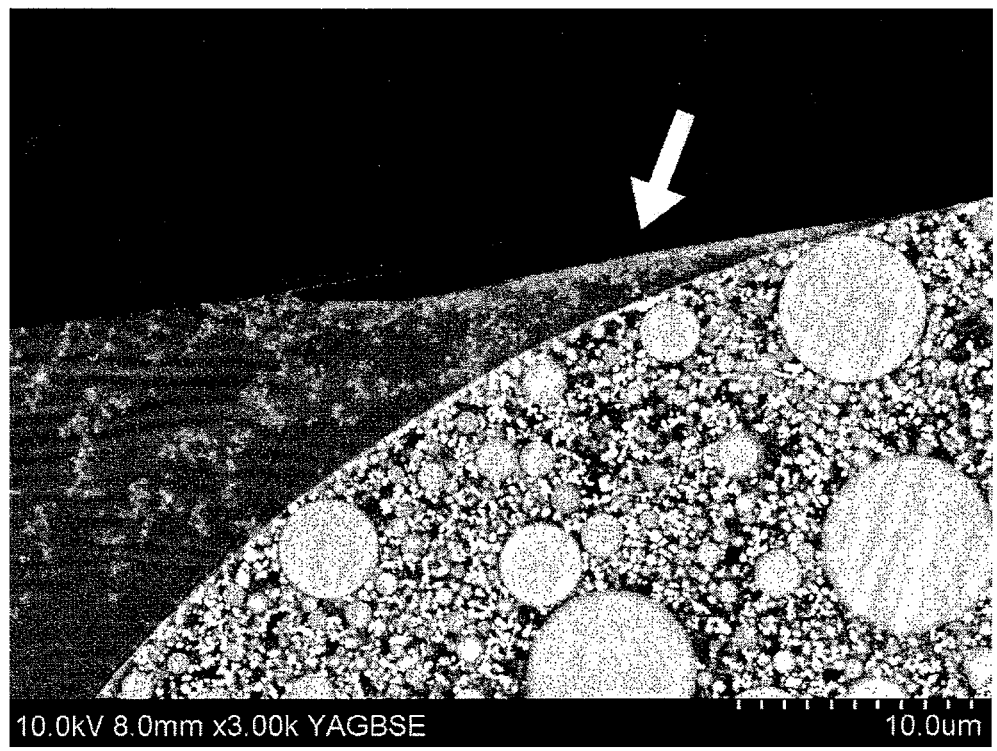
FIG. 7 shows an image of a section of the edge portion of the sealing member shown in FIG. 5 and observed by the scanning electron microscope.

FIG. 5 shows images of the top surface of an edge portion of the sealing member observed by a scanning electron microscope (S-4800 manufactured by Hitachi, Ltd.) in the light emitting device of Example 1. FIG. 6 is data on the result of an energy dispersive X-ray (EDX) analysis of the edge portion of the sealing member shown in FIG. 5. FIG. 7 is an image of a section of the edge portion of the sealing member shown in FIG. 5 and observed by the scanning electron microscope. As can be seen from FIGS. 5 and 6, at least a part of the edge portion of the sealing member is located in the vicinity of the edge of the recessed portion of the base substrate, and is a region where at least one of the particles of zirconium oxide and aggregates of the particles are unevenly distributed. This can also be confirmed in FIG. 7 (particularly, in a part indicated by an arrow).

The light emitting device of Example 1 with the above-mentioned structure can exhibit the same effects as those of the light emitting device 100 of the first embodiment.

The light emitting device according to the embodiments of the present invention can be applied to a backlight source of a liquid crystal display; various illumination tools; a large-sized display; various types of display devices dedicated for advertisement, destination guidance, and the like; image readers, such as a digital video camera, a fax machine, a copy machine, and a scanner; a projector, and the like.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   a base substrate forming a package that includes a positive lead electrode, a negative lead electrode, and a molded body holding the positive and negative lead electrodes, the base substrate having a recessed portion at a flat upper surface thereof, the recessed portion having an inner wall and a bottom surface, the inner wall being inclined such that a diameter of the recessed portion increases in an upward direction from the bottom surface;
   a light emitting element bonded to the bottom surface of the recessed portion; and
   a sealing member provided in the recessed portion that does not cover the flat upper surface of the base substrate,
   wherein the sealing member contains surface-treated particles, or particles coexisting with a dispersing agent, the particles having a particle diameter of 1 nm or more and 100 μm or less, the particles being made of an inorganic material, the inorganic material being free of a phosphor,
   at least a part of an edge portion of the sealing member is a region located in the vicinity of an edge of the recessed portion which is a boundary between a surface of the inner wall and the flat upper surface of the base substrate, at least one of the particles and aggregates of particles being unevenly distributed in the region, and
   the at least one of the particles and aggregates of particles are more localized in a surface region of the sealing member in the vicinity of the edge of the recessed portion as compared to the surface region of the sealing member in a central portion of the recessed portion.

2. The light emitting device according to claim 1, wherein the particle is a nanoparticle.

3. The light emitting device according to claim 1, wherein a content of the particles and/or the aggregates of the particles is in a range of 0.05% by weight or more and 50% by weight or less.

4. The light emitting device according to claim 1, wherein a base material of the sealing member is made of silicone resin, modified silicone resin, silicon-modified resin or hybrid silicone resin.

5. The light emitting device according to claim 1, wherein an upper surface of the sealing member is a surface extending upward in a convex shape.

6. The light emitting device according to claim 1, wherein an inorganic coating is formed over the flat upper surface of the base substrate.

7. The light emitting device according to claim 6, wherein the coating has a thickness of 1 nm or more and 50 nm or less.

8. The light emitting device according to claim 6, wherein the coating is formed of a material from the group consisting of aluminum oxide, silicone oxide, aluminum nitride, silicon nitride, and a mixture thereof.

9. The light emitting device according to claim 6, wherein the coating is formed by sputtering or atomic layer deposition.

10. The light emitting device according to claim 1, wherein a base material of the sealing member is phenyl silicone resin.

11. The light emitting device according to claim 1, wherein half or more the edge portion of the sealing member is the region located in the vicinity of the edge of the recessed portion, at least either one of the particles and aggregates of particles being unevenly distributed in the region.

12. The light emitting device according to claim 1, wherein the particle has a melting point of 260° C. or higher.

13. The light emitting device according to claim 1, wherein the sealing member contains phosphors.

14. The light emitting device according to claim 13, wherein the phosphors are at least on selected from the group consisting of yttrium-aluminum-garnet activated by cerium, a nitrogen-containing calcium aluminosilicate activated by europium and/or chromium, a sialon activated by europium, a silicate activated by europium, and a potassium fluosilicate activated by manganese.

15. The light emitting device according to claim 1, wherein the region in which at least one of the particles and aggregates of particles are unevenly distributed includes an upper portion of the sealing member.

16. The light emitting device according to claim 15, further comprising phosphors that are unevenly distributed on a bottom side of the recessed portion at which the light emitting element is disposed.

17. The light emitting device according to claim 1, wherein an inclination angle of the inner wall is 95° or more and 120° or less relative to the bottom surface of the recessed portion.

18. The light emitting device according to claim 1, wherein the particles are agglutinated and the aggregate of the particles has a diameter in a range of about 100 nm to about 300 µm.

19. The light emitting device according to claim 1, wherein the particle is an oxide.

20. The light emitting device according to claim 1, wherein the particles are formed of at least one material selected from the group consisting of silicon oxide, aluminum oxide, zirconium oxide, titanium oxide, zinc oxide, magnesium oxide, gallium oxide, tantalum oxide, niobium oxide, bismuth oxide, yttrium oxide, iridium oxide, indium oxide, and tin oxide.

21. The light emitting device according to claim 1, wherein the surface region of the sealing member in the vicinity of the edge of the recessed portion in which the at least one of the particles and aggregates of particles are localized is formed by agglutinated particles, and the surface region of the sealing member in the central portion of the recessed portion includes a region in which the particles are not agglutinated.

* * * * *